United States Patent
Dubey et al.

(10) Patent No.: US 10,535,615 B2
(45) Date of Patent: Jan. 14, 2020

(54) ELECTRONIC PACKAGE THAT INCLUDES MULTI-LAYER STIFFENER

(71) Applicant: Intel Corporation, Santa Clara, CA (US)

(72) Inventors: Manish Dubey, Chandler, AZ (US); Srikant Nekkanty, Chandler, AZ (US); Rajendra C. Dias, Phoenix, AZ (US); Patrick Nardi, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/548,741

(22) PCT Filed: Feb. 12, 2016

(86) PCT No.: PCT/US2016/017788
§ 371 (c)(1),
(2) Date: Aug. 3, 2017

(87) PCT Pub. No.: WO2016/140793
PCT Pub. Date: Sep. 9, 2016

(65) Prior Publication Data
US 2018/0033741 A1  Feb. 1, 2018

Related U.S. Application Data

(60) Provisional application No. 62/127,499, filed on Mar. 3, 2015.

(51) Int. Cl.
*H01L 23/16* (2006.01)
*H01L 23/00* (2006.01)
(Continued)

(52) U.S. Cl.
CPC ............ *H01L 23/562* (2013.01); *H01L 23/16* (2013.01); *H01L 23/498* (2013.01);
(Continued)

(58) Field of Classification Search
None
See application file for complete search history.

(56) References Cited

U.S. PATENT DOCUMENTS

| 6,989,593 B2 * | 1/2006 | Khan ................. H01L 23/3677 257/706 |
| 2004/0150101 A1 * | 8/2004 | Fraley ................ H01L 23/5383 257/723 |

(Continued)

FOREIGN PATENT DOCUMENTS

| CN | 101124857 A | 2/2008 |
| CN | 107210282 | 9/2017 |

(Continued)

OTHER PUBLICATIONS

"Taiwanese Application Serial No. 105105254, Response filed Aug. 23, 2017 to Office Action dated Feb. 22, 2017", w/ claims in English, 78 pgs.

(Continued)

*Primary Examiner* — Fernando L Toledo
*Assistant Examiner* — Valerie N Newton
(74) *Attorney, Agent, or Firm* — Schwegman Lundberg & Woessner, P.A.

(57) ABSTRACT

An electronic package that includes a substrate and a die attached to the substrate. The electronic package further includes a stiffener that is attached to the substrate adjacent to the die. The stiffener is formed of a first layer made from one material and a second layer made from a different material.

14 Claims, 4 Drawing Sheets

(51) Int. Cl.
*H01L 23/498* (2006.01)
*H01L 23/58* (2006.01)

(52) U.S. Cl.
CPC ...... *H01L 23/49838* (2013.01); *H01L 23/585* (2013.01); *H01L 2924/3511* (2013.01)

(56) References Cited

U.S. PATENT DOCUMENTS

| | | |
|---|---|---|
| 2005/0127502 A1 | 6/2005 | Lee et al. |
| 2005/0199998 A1 | 9/2005 | Chen et al. |
| 2006/0261469 A1* | 11/2006 | Ni .................. H01L 23/433 257/718 |
| 2007/0145571 A1 | 6/2007 | Lee et al. |
| 2007/0278647 A1 | 12/2007 | Morita |
| 2009/0001528 A1 | 1/2009 | Braunisch et al. |
| 2011/0156235 A1* | 6/2011 | Yuan .................. H01L 23/16 257/690 |
| 2014/0183752 A1* | 7/2014 | Lin .................. H01L 24/19 257/774 |
| 2014/0291001 A1* | 10/2014 | Lin .................. H01L 23/3121 174/261 |
| 2016/0172229 A1* | 6/2016 | Brun .................. H01L 21/6836 428/614 |

FOREIGN PATENT DOCUMENTS

| | | |
|---|---|---|
| TW | 201644015 A | 12/2016 |
| TW | I614851 B | 2/2018 |
| WO | WO-2016140793 A1 | 9/2016 |

OTHER PUBLICATIONS

"International Application Serial No. PCT/US2016/017788, International Preliminary Report on Patentability dated Sep. 14, 2017", 9 pgs.

"International Application Serial No. PCT/US2016/017788, International Search Report dated May 30, 2016", 3 pgs.

"International Application Serial No. PCT/US2016/017788, Written Opinion dated May 30, 2016", 7 pgs.

"Taiwanese Application Serial No. 105105254, Office Action dated Feb. 22, 2017", w/ brief summary from agent's letter and English translation of search report, 11 pgs.

* cited by examiner

ELECTRONIC PACKAGE THAT INCLUDES MULTI-LAYER STIFFENER

CLAIM OF PRIORITY

This patent application is a U.S. National Stage Filing under 35 U.S.C. 371 from International Application No. PCT/US2016/017788, filed on 12 Feb. 2016, and published as WO 2016/140793 on 9 Sep. 2016, which application claims the benefit of U.S. Provisional Patent Application No. 62/127,499, filed Mar. 3, 2015, entitled "ELECTRONIC PACKAGE AND METHOD OF CONNECTING A FIRST DIE TO A SUBSTRATE TO FORM AN ELECTRONIC PACKAGE", each of which are incorporated by reference herein in their entirety.

TECHNICAL FIELD

Embodiments described herein generally relate to an electronic package that includes a multi-layer stiffener.

BACKGROUND

Minimizing transistor size in order to keep up with Moore's law continually requires reducing first level interconnect (FLI) pitch and bump size. In addition, using advanced dielectrics has often resulted in utilizing low-k and extremely low-k materials in silicon.

The combination of these factors results in higher sensitivity to stress during assembly and thermo-mechanical stress. Therefore, with each new technological advancement, solutions for reducing thermo-mechanical stress become significantly more important.

The thickness of semiconductor devices has been shrinking with the advent of small form factor devices such as smartphones and tablets. As a result, coreless packaging is gaining more attention for small form factor devices. The absence of a core in the substrate of electronic packages typically implies that there is relatively higher warpage for such conventional packages.

One other advancement in packaging technology has been in the area of ball grid array (BGA) pitch reduction, which is often capable of obtaining smaller form factors. The combination of coreless packaging and reduced BGA pitch requires very tight peak to valley warpage control of the electronic package in order to fabricate such electronic packages using an efficient surface mount (SMT) process.

Two of the solutions that are commonly employed used to overcome the warpage problem are to use (a) molded underfill (MUF) and (b) a stiffener. The thickness of the MUF and the stiffener is driven by the thickness of the dice that form the electronic package.

These existing solutions are often able to provide sufficient process control for electronic packages where the die thickness is ~300 microns or greater. However, these existing solutions are often unable to provide sufficient process control (i.e., too much warpage) for electronic packages as the die thickness becomes smaller (e.g., gets closer to 100-200 microns).

BRIEF DESCRIPTION OF THE DRAWINGS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The electronic packages and methods described herein may address issues associated with maintaining warpage control on thinner dice with tighter BGA pitch. The basic principle is based on the CTE mismatch, which is what drives warpage in the first place.

The electronic packages and methods described herein use a bimetallic two-material stiffener which not only provides stiffness when the packages warps but also provides an opposing moment at higher temperatures to further reduce warpage. The opposing moment will counter the high temperature warpage of the electronic package, thereby reducing the mean warpage of the entire package.

Figure 1:
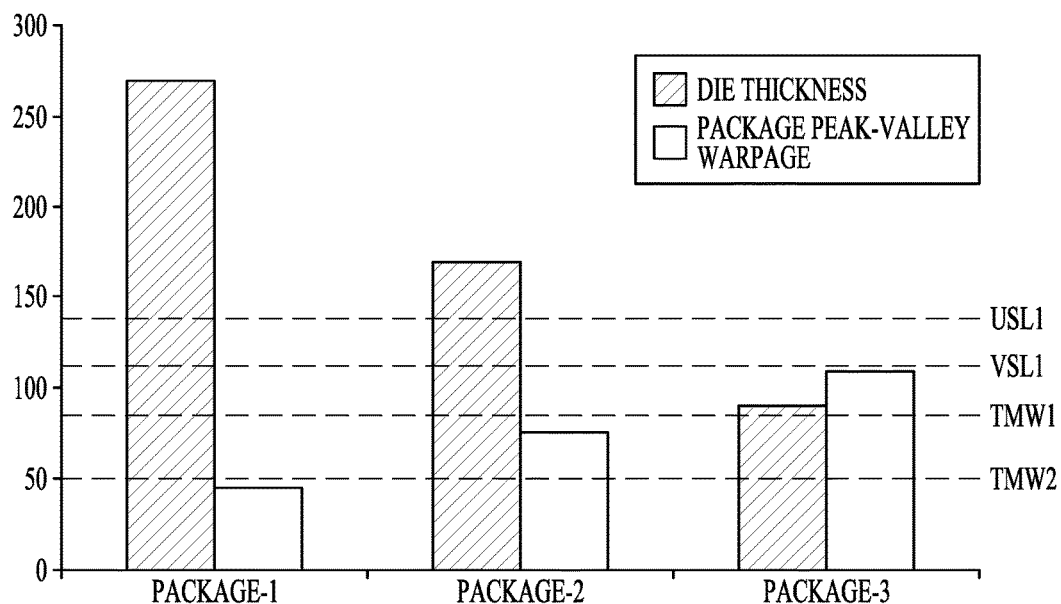
FIG. 1 shows the changes in peak-to-valley warpage as a function of die thickness.

Modeling data is presented in FIG. 1 that illustrates where warpage control gets worse as stiffeners become thinner on the same electronic package. Specifically, FIG. 1 shows the changes in peak-to-valley warpage as a function of die thickness. It is important to note that the thickness of the stiffener in this modeling was assumed to be the same as the die thickness.

As shown in FIG. 1, for the same package dimensions, the warpage gets worse as the dice get thinner. As an example, the target mean warpage TMW1 and the upper spec limit USL1 for 0.4 mm BGA pitch and 0.035 BGA pitch as shown in FIG. 1. In addition, the target mean warpage TMW1 and upper spec limit USL1 for 0.4 mm BGA pitch is 80 and 140 µm respectively. While this is achievable for 270 µm dice as seen in FIG. 1, it becomes more difficult for thinner dice.

Apart from the thickness of the die, BGA pitch reduction to 0.35 mm requires the target mean warpage TMW2 to drop down to 50 µm and the upper spec limit USL2 to drop down to 110 µm. This modeling data clearly shows that conventional stiffeners (e.g., conventional stainless steel stiffeners) do not provide the warpage control that is required for electronic packages with reduced die thickness and reduced BGA pitch.

Figure 2:
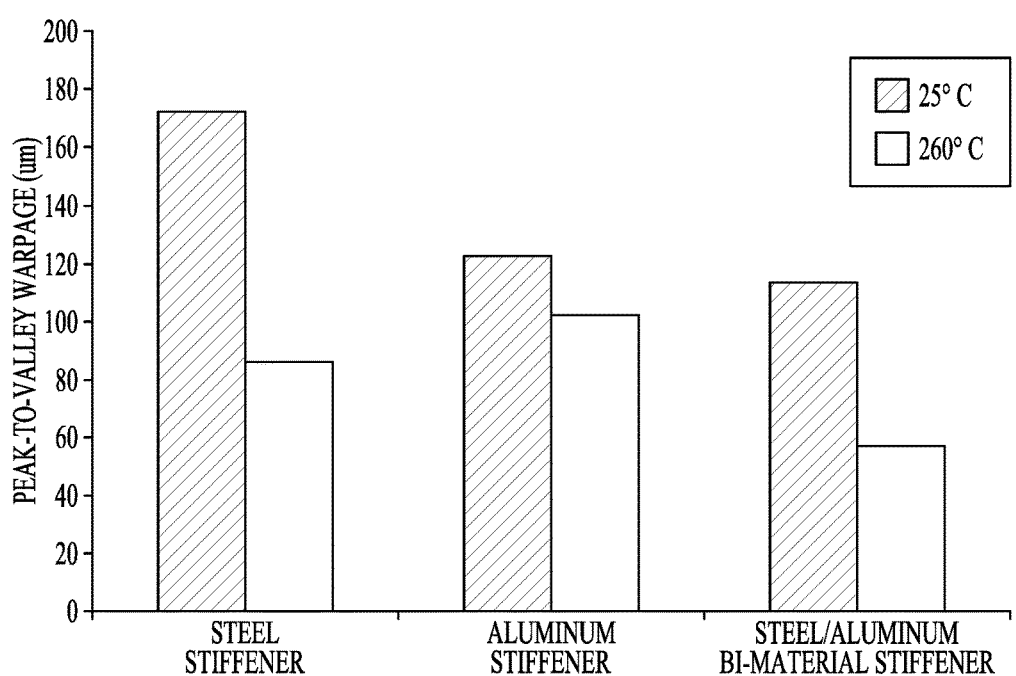
FIG. 2 shows modeling data that demonstrates where using bimetallic material stiffeners may provide improved warpage control during SMT of thin dice.

The bimetallic two-material stiffener may provide warpage control on future thin die electronic packages that require tighter BGA pitch. FIG. 2 shows modeling data that demonstrates where using bimetallic two-material stiffeners may provide improved warpage control during SMT of thin dice.

Specifically, FIG. 2 shows as examples 25° C. and greater than 200° C. P-V the peak-to-valley warpage for (a) steel; (b) aluminum; and (c) steel/aluminum bimetallic strip and warpage. FIG. 2 further shows a significant reduction in peak-to-valley warpage (~35%) when using a bimetallic two-material stiffener as compared to a monolithic stiffener.

As an example, a peak may equal the largest deflection in one direction and a valley may equal the largest deflection in an opposite direction. Deflection as measured may be considered the distance that the peak (or valley) is out of plane from a not deflected state of the electronic package.

The bimetallic stiffener materials and thicknesses may be selected for different die thickness such that the bimetallic two-material stiffener height does not exceed the die thickness. Therefore, the backside of the die may be exposed for thermal attachment to a substrate (e.g., to a heat sink).

As discussed above, the modeling data as shown in FIG. 2 demonstrates a considerable improvement for high temperature warpage (35% better than steel and 45% better than aluminum). The room temperature warpage is also considerably better than the two monolithic stiffeners (35% better than steel and 7% better than aluminum). The modeling assumed equal thickness (100 µm) for both of the metals in the bimetallic case for the sake of simplicity.

In some forms, further reduction in warpage may be achieved by tailoring the thickness and other material properties of the two metals. As an example, two materials may be selected with different CTE where the correct one is put on top so that the stiffener incorporates a bending moment that counters the expected warpage of the electronic package upon exposure to different temperatures. In addition, even better performance may be achieved by using multilayered metallic stiffener systems.

In addition to providing better warpage control for thin dice, the bimetallic two-material stiffener may also require a smaller footprint as compared to monolithic stiffeners. This smaller footprint may provide a smaller keep out zone (KOZ) for stiffeners. The smaller KOZ reduction may reduce the form factor of the electronic package without compromising warpage control of the electronic package.

Figure 3:
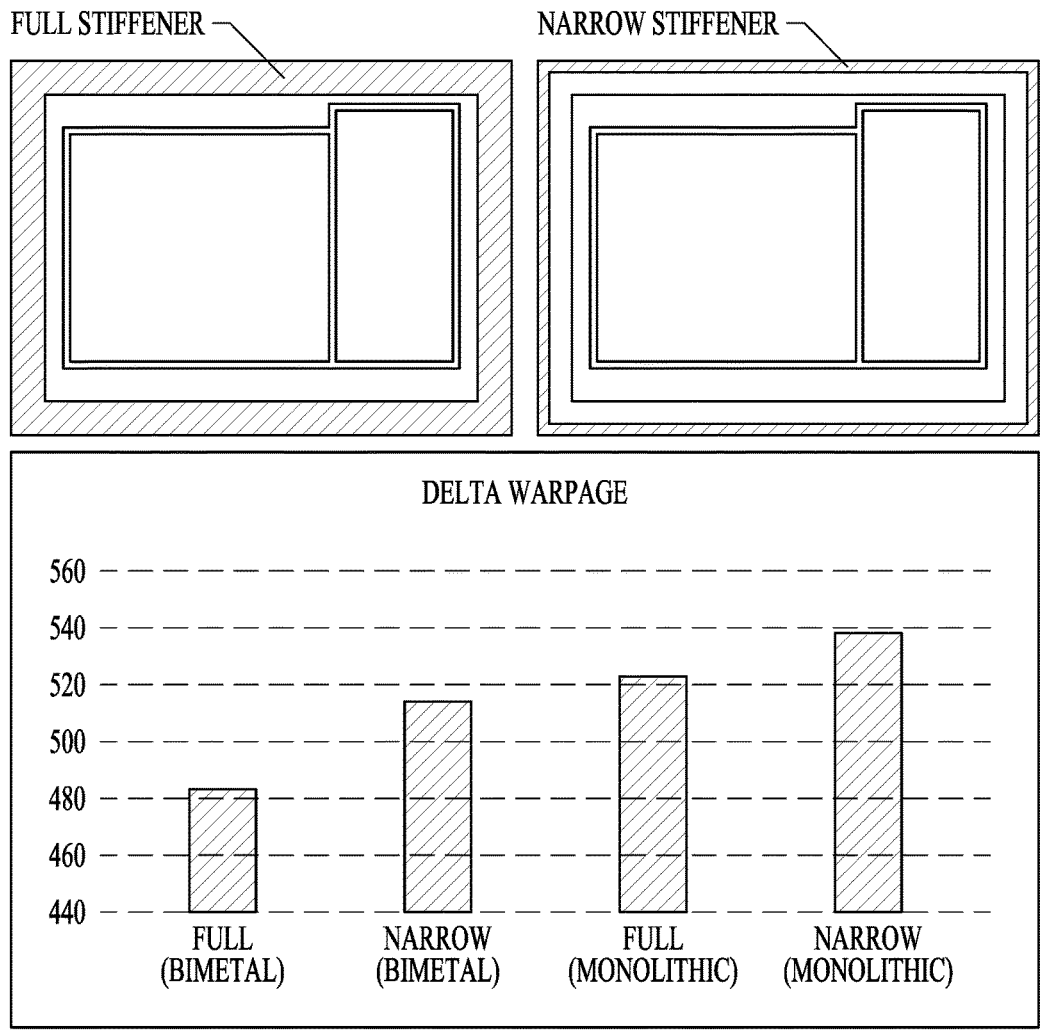
FIG. 3 shows modeling data that demonstrates where even after reducing the width of the stiffener a bimetallic stiffener, the warpage may be less than a full width monolithic stiffener.

FIG. 3 shows the change in peak-to-valley warpage by reducing the width of the stiffener for bimetallic (e.g., aluminum & stainless steel) and monolithic (e.g., stainless steel) stiffeners. It should be noted that the peak-to-valley warpage for the narrow bimetallic two-material stiffener is still lower than the warpage for the full monolithic stiffener.

Specifically, the modeling data in FIG. 3 shows that even after reducing the width of the two-material stiffener by ~50%, the delta warpage (25-260° C.) of the bimetallic two-material stiffener is less than a full width monolithic stiffener. FIG. 3 shows the modeling data obtained on a 170 µm thin die/stiffener. FIG. 3 further illustrates that the delta warpage (25-260° C.) for the narrow (650 µm on all sides) bimetallic two-material stiffener is lower than the warpage of the full (1250 µm on 2 sides and larger on other 2 sides) monolithic stiffener.

In some forms, the bimetallic two-material stiffener may be used to lower the high temperature warpage of the electronic package. Lowering the high temperature warpage of the electronic package may be achieved by joining the bimetallic sheets at higher temperature, which will produce stiffeners that are flat at the joining temperature. While joining the bimetallic sheets at higher temperature may not change the amount of warpage over a range of temperatures, it may provide another way to control warpage depending on the electronic package design and the desired warpage requirements.

Figure 4:
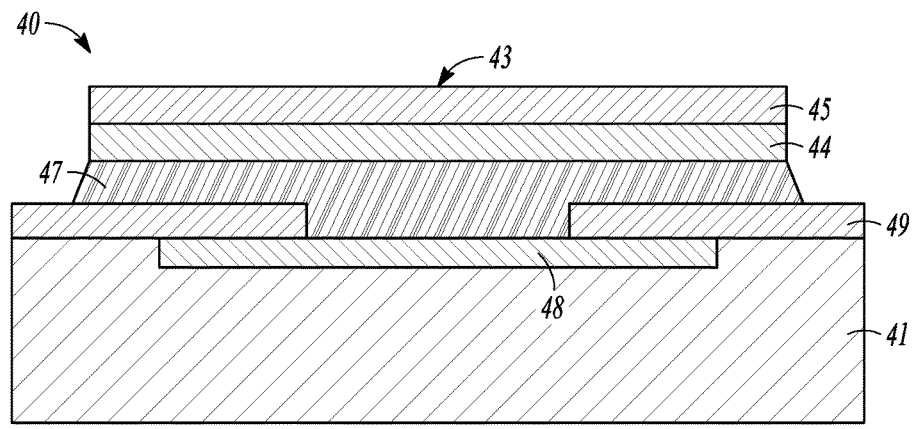
FIG. 4 shows that the materials for the bimetallic stiffener may be chosen to form chemical/metallurgical joints with a conductive adhesive.

In addition, the bimetallic two-material stiffeners described herein may provide for a stiffener where the stiffener needs to be grounded to the substrate. FIG. 4 shows that while it may be difficult to adhere metallic adhesive (e.g., solder) to stainless steel, the materials for the bimetallic material may be chosen to form electrical/chemical/metallurgical joints with the conductive adhesive to facilitate the stiffener conducting electricity.

In the example form shown in FIG. 4, the bimetallic stiffener may provide an added benefit in situations where the stiffeners needs to be grounded to the substrate. While it is often difficult to adhere a metallic adhesive (e.g., solder) to stainless steel, the bimetallic materials may be chosen and arranged to form electrically conductive joints with the conductive adhesive.

Figure 5:
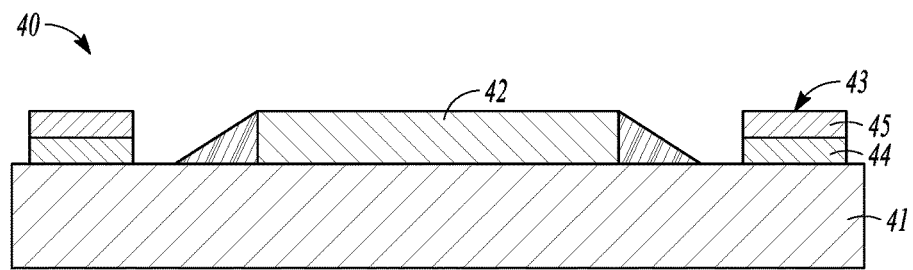
FIG. 5 shows the cross-sectional view of an example electronic package.

FIG. 4 is an enlarged view illustrating a portion of an example electronic package. FIG. 5 illustrates the entire electronic package for the enlarged portion of the electronic package shown in FIG. 4.

As shown in FIGS. 4 and 5, the electronic package 40 includes a substrate 41 and a die 42 (see FIG. 5) attached to the substrate 41. The electronic package 40 further includes a stiffener 43 that is attached to the substrate 41 adjacent to the die 42. The stiffener 43 is formed of a first layer 44 made from one material and a second layer 45 made from a different material.

In some forms, the stiffener 43 entirely surrounds the die 42. In other forms, the stiffener 43 may partially surround the die 42. The determination to whether the stiffener 43 surrounds the entire die 42 will depend in part on the footprint design of the electronic package 40 (among other factors).

In addition, the stiffener 43 may be concentric with the die 42. The stiffener 43 may also be partially concentric with the die 42.

In some forms, stiffener 43 may have a substantial uniform cross-section. In other forms, the cross-section of the stiffener 43 may change in size. As an example, two opposing sides of the stiffener 43 may have one type of cross-section and the other two opposing sides may have another type of cross-section.

In addition, the first layer 44 may be the same size as the second layer 45. It should be noted that forms of the electronic package 43 are contemplated where the first layer 44 and the second layer 45 are different sizes.

In addition, the first layer 44 may have a different thickness than the second layer 45. In other forms, the first layer 44 may the same thickness as the second layer 45. The relative thicknesses of the first layer 44 and the second layer 45 will depend in part on die 42 thickness, package dimensions, and the available footprint for the stiffener 43 (among other factors).

In some forms, the first layer 44 may be made of aluminum and the second layer 45 may be made of stainless steel. In another form, the first layer 44 may be made of a nickel alloy and the second material may be made of a manganese-copper-nickel alloy. It should be noted that a variety of materials are contemplated for the first layer 44 and the second layer 45. Some of the factors that determine the selection of the first layer 44 and the second layer 45 include (i) die thickness; (ii) package dimensions; (iii) package warpage; (iv) available foot-print of the stiffener 43; (v) ease of manufacturing; and/or (vi) cost (among other factors).

Figure 6:
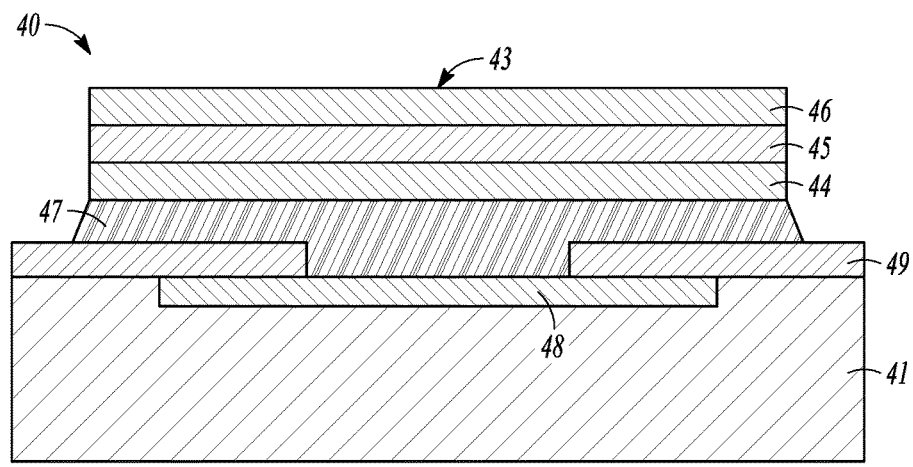
FIG. 6 shows another form of the electronic package shown in FIG. 4.

FIG. 6 shows another example form of the electronic package 40. In the example electronic package 40 shown in FIG. 6, the stiffener 43 in the electronic package 40 includes a third layer 46 that is made of a different material than the first layer 44 and the second layer 45. It should be noted that the relative size and thicknesses of the first layer 44, the second layer 45 and the third layer 46 will depend in part on many of the factors described above.

As shown in FIGS. 4 and 6, the electronic package 40 may further include a conductive adhesive 47 that secures the substrate 41 to the first layer 44 of the stiffener 43. First layer 44 is formed of an electrically conductive material such that the first layer 44 and the conductive adhesive 47 are electrically connected together.

In some forms, the substrate 41 of the electronic package 40 include a ground plane 48 such that the conductive adhesive 47 electrically connects the first layer 44 of the stiffener 43 to the ground plane 48.

As shown in FIGS. 4 and 6, an upper surface of the substrate 41 may include a solder resist 49 such that the ground plane 48 is exposed through the solder resist 49. The degree to which the ground plane 48 is exposed through the solder resist 49 may depend in part on the type of conductive adhesive 47 and the size of the first layer 44 of the stiffener 43 (among other factors).

In some forms, additional organic and inorganic layers may be included as part of the solder resist 49. The type solder resist 49 that is included in the electronic package 40 will depend in part on manufacturing considerations and the types of materials that are used for the conductive adhesive 47 and the package substrate 41 (among other factors).

In some forms, the first layer 44 may be bonded to the second layer 45 before (or after) the stiffener 43 is attached to substrate 41. As examples, the first layer 44 may be bonded to the second layer 45 by laminating (e.g., rolling) the first layer 44 to the second layer 45 and/or plating the first layer 44 and the second layer 45 to the other of the first layer 44 and the second layer 45.

The stiffener 43 may be configured to oppose the bending moment of the overall electronic package in order to improve the peak-to-valley warpage. The relative thickness, co-efficient of thermal expansion (CTE) and other material properties of the chosen materials for the stiffener 43 may be selected to provide the desired warpage properties, especially during SMT of thin dice. As an example, the CTE, thickness and other material properties of the first material and the second material may be tailored to provide an opposing moment to the electronic package warpage, especially at high temperatures in order to improve overall peak-to-valley warpage.

WARPAGE EXAMPLE

Warpage modeling was conducted on a 20×20 mm coreless substrate with a 270 μm thick 10×10 mm die. The thickness and width of the modeled stiffener was 200 μm and 2 mm respectively.

Figure 7A:
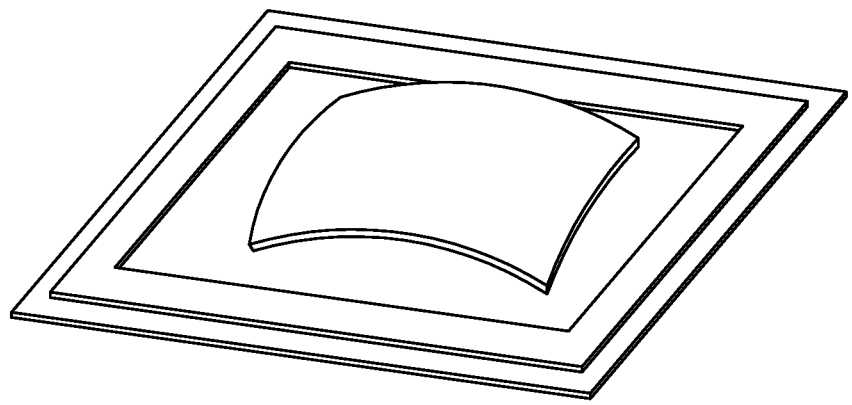
FIGS. 7A-7B shows example exaggerated room temperature and high temperature warpage on a bimetallic stiffener system.
Figure 7B:
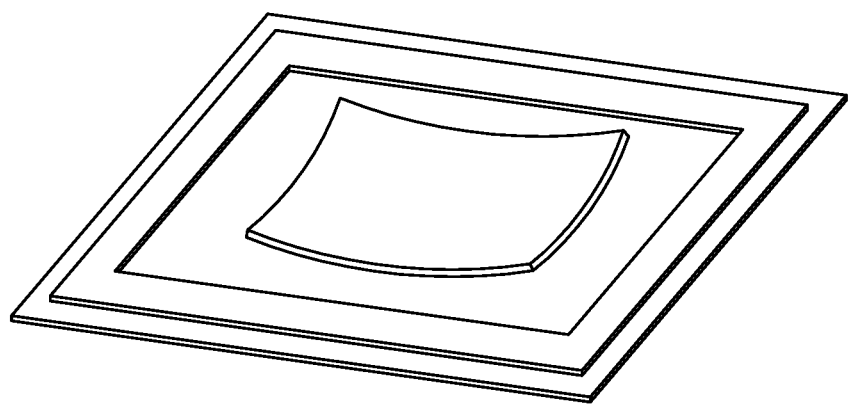

FIGS. 7A and 7B show the (a) room temperature and (b) high temperature warpage on a bimetallic stiffener system. The images have been exaggerated 30 times to highlight the warpage.

This overview is intended to provide non-limiting examples of the present subject matter—it is not intended to provide an exclusive or exhaustive explanation. The detailed description is included to provide further information about the electronic packages.

To better illustrate the electronic packages disclosed herein, a non-limiting list of examples is provided here:

Example 1 includes an electronic package. The electronic package includes a substrate and a die attached to the substrate. A stiffener attached to the substrate adjacent to the die, wherein the stiffener is formed of a first layer made from one material and a second layer made from a different material.

Example 2 includes the electronic package of claim 1, wherein the stiffener surrounds the die.

Example 3 includes the electronic package of any one of claims 1-2, wherein the stiffener is secured to the substrate with a conductive adhesive, wherein the first layer of the stiffener engages the conductive adhesive and the first layer is formed of an electrically conductive material.

Example 4 includes the electronic package of any one of claims 1-3, wherein the first material has a first coefficient of thermal expansion (CTE) and the second material has a lower CTE than the first material, wherein the stiffener has a bending moment that is substantially opposite to a warpage of the electronic package when a temperature change is applied to the electronic package.

Example 5 includes the electronic package of any one of claims 1-4, wherein the stiffener has a substantially uniform cross-section.

Example 6 includes the electronic package of any one of claims 1-5, wherein the first layer is the same size as the second layer.

Example 7 includes the electronic package of any one of claims 1-6, wherein the first layer has a different thickness than the second layer.

Example 8 includes the electronic package of any one of claims 1-7, wherein the first layer is aluminum and the second layer is stainless steel.

Example 9 includes the electronic package of any one of claims 1-8, wherein the stiffener includes a third layer made from a different material than the first layer and the second layer.

Example 10 includes an electronic package. The electronic package includes a substrate and a die attached to the substrate. A stiffener is formed of a first layer made from a conductive material and a second layer made from a different material, and a conductive adhesive that secures the substrate to the first layer of the stiffener.

Example 11 includes the electronic package of claim 10, wherein the stiffener surrounds the die.

Example 12 includes the electronic package of any one of claims 10-11, wherein the stiffener is concentric with the die.

Example 13 includes the electronic package of any one of claims 10-12, wherein the substrate includes a ground plane and the conductive adhesive electrically connects the first layer of the stiffener to the ground plane.

Example 14 includes the electronic package of any one of claims 10-13, wherein an upper surface of the substrate includes a solder resist and the ground plane is exposed through the solder resist.

Example 15 includes the electronic package of any one of claims 10-14, wherein the first layer is bonded to the second layer.

Example 16 includes the electronic package of any one of claims 10-15, wherein the stiffener has a substantially uniform cross-section, and wherein the first layer is the same size as the second layer.

Example 17 includes the electronic package of any one of claims 10-16, wherein the first layer is aluminum and the second layer is stainless steel.

Example 18 includes an electronic package. The electronic package includes a substrate and a die attached to the substrate. A stiffener attached to the substrate such that the stiffener surrounds the die, wherein the stiffener is formed of an aluminum layer and a second stainless steel layer made from a different material, wherein the stiffener has a substantially uniform cross-section, and wherein the aluminum layer is the same size as the stainless steel layer.

Example 19 includes the electronic package of claim 18, wherein the substrate includes a ground plane and a conductive adhesive that secures the aluminum layer of the stiffener to the ground plane such that the aluminum layer of the stiffener is electrically connected to the ground plane.

Example 20 includes the electronic package of any one of claims 18-19, wherein an upper surface of the substrate includes a solder resist and the ground plane is exposed through the solder resist.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An electronic package comprising:
   a substrate;
   a die attached to the substrate;
   a stiffener attached to the substrate adjacent to the die, wherein the stiffener is formed of a first layer made from one material, a second layer made from a different material, and a third layer made from a different material than the first layer and the second layer, wherein the first layer, the second layer and the third layer each laterally surround the die, wherein the stiffener does not extend over an upper surface of the die.

2. The electronic package of claim 1, wherein the first material has a first coefficient of thermal expansion (CTE), the second material has a lower CTE than the first material, and the third material has a lower CTE than the second material, wherein the stiffener has a bending moment that is substantially opposite to a warpage of the electronic package when a temperature change is applied to the electronic package.

3. The electronic package of claim 1, wherein the stiffener has a substantially uniform cross-section.

4. The electronic package of claim 1, wherein the first layer is the same size as the second layer and the third layer.

5. The electronic package of claim 1, wherein the first layer has a different thickness than the second layer and the third layer.

6. The electronic package of claim 1, wherein the first layer is aluminum and the second layer is stainless steel.

7. An electronic package comprising:
   a substrate;
   a die attached to the substrate;
   a stiffener formed of a first layer made from a conductive material and a second layer made from a different material; and
   a conductive adhesive that secures the substrate to the first layer of the stiffener, wherein the substrate includes a ground plane and the conductive adhesive electrically connects the first layer of the stiffener to the ground plane, wherein an upper surface of the substrate includes a solder resist and the ground plane is exposed through the solder resist.

8. The electronic package of claim 7, wherein the stiffener surrounds the die.

9. The electronic package of claim 7, wherein the first layer and the second layer are each concentric with the die.

10. The electronic package of claim 7, wherein the first layer is bonded to the second layer.

11. The electronic package of claim 7, wherein the stiffener has a substantially uniform cross-section, and wherein the first layer is the same size as the second layer.

12. The electronic package of claim 7, wherein the first layer is aluminum and the second layer is stainless steel.

13. An electronic package comprising:
- a substrate;
- a die attached to the substrate, wherein the substrate includes a ground plane and further includes a solder resist on an upper surface of the substrate such that the ground plane is exposed through the upper surface solder resist;
- a stiffener attached to the substrate such that the stiffener surrounds the die, wherein the stiffener is formed of an aluminum layer and a second stainless steel layer made from a different material, wherein the stiffener has a substantially uniform cross-section, and wherein the aluminum layer is the same size as the stainless steel layer; and
- a conductive adhesive that secures the aluminum layer of the stiffener to the ground plane such that the aluminum layer of the stiffener is electrically connected to the ground plane.

14. The electronic package of claim 13, wherein the aluminum layer and the second stainless steel layer are each concentric with the die.

* * * * *